United States Patent [19]
Ahern et al.

[11] Patent Number: 4,963,334
[45] Date of Patent: Oct. 16, 1990

[54] HIGH TEMPERATURE HEAT PIPE CORACLE AND PROCESS

[75] Inventors: Brian S. Ahern, Boxboro; Robert M. Hilton, Chelmsford, both of Mass.

[73] Assignee: The United States of America as represented by the Secretary of the Air Force, Washington, D.C.

[21] Appl. No.: 393,169

[22] Filed: Aug. 14, 1989

[51] Int. Cl.⁵ .................. C30B 15/22; C30B 15/24
[52] U.S. Cl. .................. 422/249; 156/607; 156/619.1
[58] Field of Search .......... 156/619.1, 617.1, 618.1, 156/620.2, 620.4, DIG. 98, DIG. 70, 607; 422/248, 249, 245

[56] References Cited

U.S. PATENT DOCUMENTS

| 4,167,554 | 9/1979 | Fisher | 422/249 |
| 4,264,406 | 4/1981 | Hacskaylo | 156/616 R |
| 4,597,949 | 7/1986 | Jasinski et al. | 422/249 |
| 4,613,486 | 9/1986 | Tatsumi et al. | 422/310 |
| 4,681,995 | 7/1987 | Ahern et al. | 219/10.51 |

FOREIGN PATENT DOCUMENTS 0081094  5/1985  Japan .................. 156/607

OTHER PUBLICATIONS

Goodman, *Crystal Growth Theory & Techniques*, vol. 1, Plenum Press, 1974, pp. 248–249.

Yamaguchi, et al., CA106(8):59393r, 9/30/86.
Kotani et al., CA 109(26):241358x, 12/8/86.
Watanabe et al., CA 98(26):2254280, 1983.

*Primary Examiner*—Gary P. Straub
*Assistant Examiner*—Stephen G. Kalinchak
*Attorney, Agent, or Firm*—Stanton T. Collier; Donald J. Singer

[57] ABSTRACT

A heat pipe coracle is provide for use in a crystal growth apparatus; the heat pipe coracle includes a coracle ring, the coracle ring being composed of a material resistant to attack from a melt of the crystal growth apparatus and having density less than the melt so as to float upon the melt, the coracle ring having a central opening therethrough, the central opening being of a diameter approximately equal to that of a single crystal pulled from the melt through said central opening, the single crystal being in sliding contact with the coracle ring to insure uniform heat distribution about a vertical axis near an interface between the single crystal and the melt, and means for centering the coracle ring within a crucible of the crystal growth apparatus, the means for centering fixedly attached to the coracle ring and resistant to attack from said melt, the means for centering being in sliding contact with the wall of the crucible so that the heat pipe coracle can float upon said melt and below an encapsulating fluid, as desired, and move in a vertical direction.

12 Claims, 2 Drawing Sheets

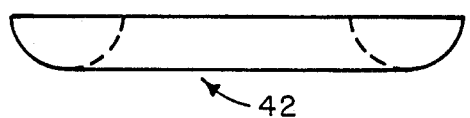
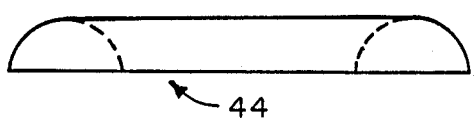
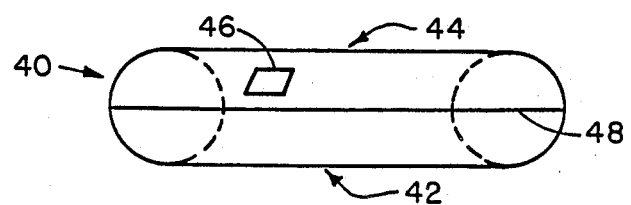
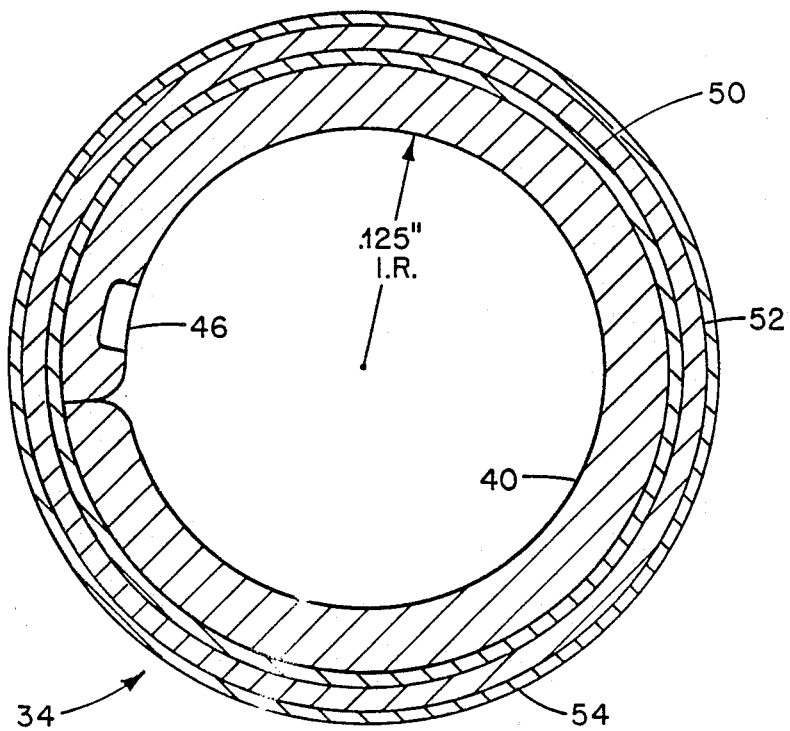

HIGH TEMPERATURE HEAT PIPE CORACLE AND PROCESS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to crystal growth and, in particular, to crystal growth using the Czochralski method.

Crystal pulling from a melt is at present the primary method for production of a variety of crystal materials of industrial importance with diameters of up to and in excess of 7 inches and lengths up to and in excess of 7 feet. A melt containing the desired proportions of materials is placed in an appropriate container and is heated under a gas atmosphere to above its melting point by means of a heat source which may be a resistance, radio frequency or electron beam heater. With the melt at the desired temperature, a crystal seed of specified crystallographic orientation is contacted with the melt surface from above and the temperature is adjusted such that crystal-melt contact is maintained and the materials of the melt solidify onto the seed material in a manner replicating the seed structure upon lifting of the seed crystal which is attached to a lifting device. During subsequent crystal pulling, the diameter of the growing crystal being pulled is increased or decreased as desired by appropriate adjustments of parameters such as the melt temperature. In order to accomplish growth of materials which exhibit an excessive vapor pressure at the freezing point, the melt may be encapsulated with an immiscible inert fluid (of lower density than the melt) such as, for example, $B_2O_3$, and growth is conducted at ambient pressures in excess of the vapor pressure of the most volatile melt constituent.

It is a fact that even under optimized use of the controllable growth parameters, the conventional process of pulling crystals from a melt results in materials with crystalline and chemical perfection which is significantly less than theoretical. The material deficiencies can largely be attributed to lack of heat transfer control within the hot zone which gives rise to asymmetry in thermal field distribution within the melt and to uncontrolled and time, varying axial and radial temperature distribution in the growing region of the crystal.

More stringent property requirements in materials such as silicon and gallium arsenide, dictated by emerging device technology, have established a need for effective heat transfer control during crystal growth of single crystals. In particular there is need to control the axisymmetric thermal gradients about the growth interface and along the growing crystal. In particular the axisymmetric heat losses are primarily derived from convective heat transfer under turbulent conditions when growing GaAs, InP and CdTe.

For example, in U.S. Pat. No. 4,579,949 which is incorporated by reference, a heat pipe 12 is placed about a growing crystal 30 to provide a controlled radial thermal gradient. The heat pipe 12 is placed in close proximity and above the surface and about the crystal emerging from the melt. The heat pipe 12 is not in direct contact with the growing crystal or the melt. A heating and/or cooling means 26 is attached by insulating means 24 to the heat pipe 12 to provide greater control over the temperature environment at the crystal/melt interface 34. This is shown in contact with the melt. The position of the heat pipe 12 can be changed by the axial positioning means 28.

It is also noted in this patent that the heat pipe 12 is constructed of stainless steel, nickle-based alloys, molybdenum-base alloys or quartz.

Although this patent helps to minimize temperature variations, greater control of the environment is still desirable.

SUMMARY OF THE INVENTION

The present invention provides an improved crystal growth apparatus that essentially eliminates asymmetrical heat flow in the region of actual crystal growth being at the interface of the solid crystal and liquid melt.

The invention comprises a conventional crystal growth furnace having means for controlling the atmosphere therein; a heating means inside the furnace; a means for holding the crystal growth melt and the same being positioned within the heating means; means for rotating and translating a seed crystal and the subsequently grown crystal and a heat pipe coracle for floating in and u-on the melt and below the encapsulating fluid.

The heat pipe coracle is formed by a ring-shaped coracle pipe and spacer means attached thereto. The spacer means function to keep the heat pipe centered in the crucible and are not attached to the crucible walls so that the heat pipe coracle can float upon the melt. As such, clearly, the heat pipe coracle must be less dense than the material of the melt and denser than the material of the encapsulating fluid. The heat pipe coracle should float at a level where the interface region is located. The heat pipe coracle thus must have a hole therethrough for pulling a crystal and the crystal must be in close proximity to the heat pipe ring surface. As the crystal is pulled from the melt, the heat pipe coracle forms in effect, an extrusion hole. As a result of this invention, there is a high degree of uniformity in heat distribution in the critical area of the interface region.

It is also further required that the material of the heat pipe coracle be such that it is not attacked by the materials in the melt and/or encapsulating fluid.

It is therefore one object of the present invention to provide a heat pipe coracle for a crystal growth apparatus that will essentially eliminate circumferential non-uniformities in the temperature profile.

It is another object of the present invention to provide a heat pipe coracle that acts as a high thermal diffusivity barrier to inhibit the growth of facets.

It is another object of the present invention to provide a heat pipe coracle for a crystal growth apparatus that reduces the radial temperature gradients in and near the crystal-melt interface.

It is another object of the present invention to provide a heat pipe coracle that contacts and floats in the melt with an acceptable lifetime.

It is another object of the present invention to provide a crystal growth apparatus with greatly improved quality and yield of single crystals therefrom.

These and many other objects and advantages of the present invention will be readily apparent to one skilled in the pertinent art from the following detailed description of a preferred embodiment of the invention and the related drawings.

BRIEF DESCRIPTION OF THE DRAWINGS

FIGS. 3A and 3B illustrate by view the to and bottom halves of the inner pipe.

FIG. 4 illustrates by view the assembled inner pipe.

FIG. 5 illustrates by cross section the heat pipe of the coracle.

DETAILED DESCRIPTION OF THE PREFERRED EMBODIMENT

Figure 1:
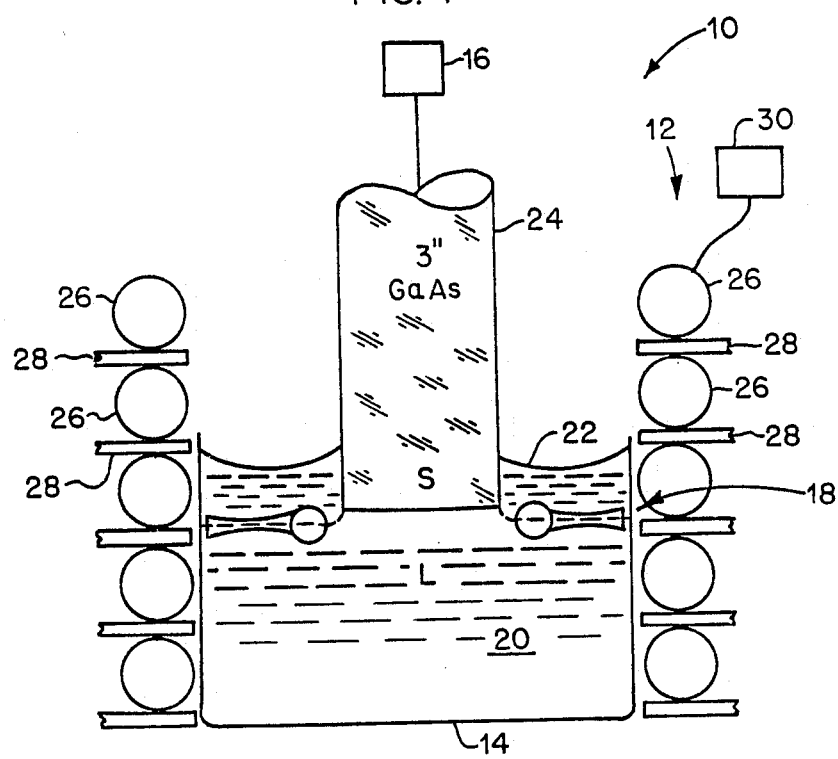
FIG. 1 illustrates by cross section the crystal growth apparatus with the heat pipe coracle therein.

Referring to FIG. 1, a crystal growth apparatus 10 is shown partially. A container for controlling the atmosphere about apparatus 10 is not shown but considered conventional. Apparatus 10 includes a heating means 12, a crucible 14, means for moving a crystal 16, and a heat pipe coracle 18. The crucible 14 has a melt 20 therein and an encapsulating fluid 22 thereon with a single crystal 24 being pulled from the melt 20 through heat pipe coracle 18. Thermocouples or other temperature sensing means are use as appropriate.

In further detail, heating means 12 may be a resistive furnace or RF coils or stacked heat pipe rings being RF driven as disclosed in U.S. Pat. No. 4,681,995 being incorporated by reference. In this preferred embodiment, a plurality of heat pipe rings 26 are stacked about the crucible 14 having also a plurality of insulator spacers 28 between the rings 26. An RF source 30 applies power to each ring 26. In combination the heat emitted by the rings 26 causes the material in the crucible 14 to liquify to form the melt 20. The heat pipe coracle 18 is designed to float on the melt 20 and under the encapsulating fluid 22 if this is required to maintain the volatile compounds in the melt 20. The crystal moving means 16 is a conventional device for holding a crystal seed, not shown, for rotating and pulling the single crystal 24 from the melt 20.

Figure 2:
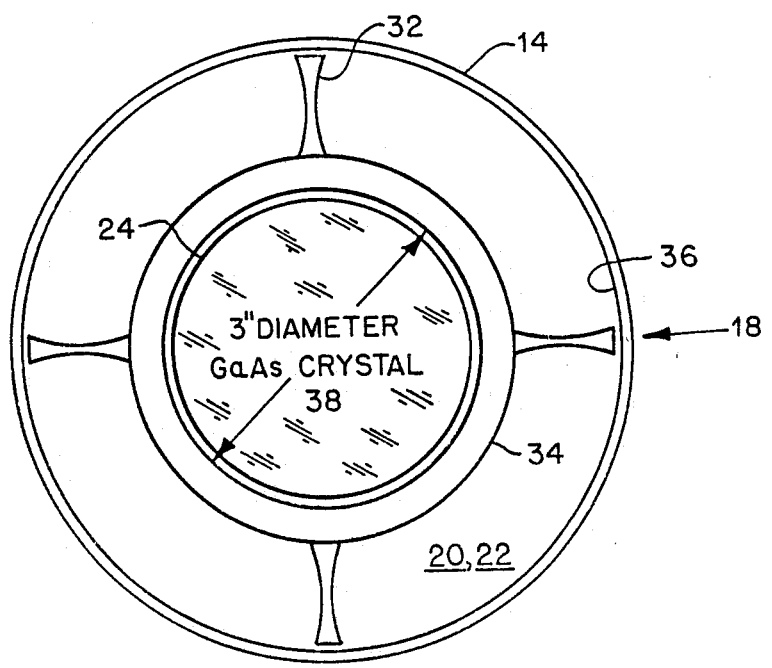
FIG. 2 illustrates by top view the heat pipe coracle in the crucible with melt therein.

In greater detail, the heat pipe coracle 18 is shown by top view in FIG. 2. A coracle ring 34 is positioned within the crucible 14 by means of at least three centering arms 32. The centering arms 32 are in sliding contact with an inner wall 36 of the crucible 14 and are fixedly attached to the coracle ring 34. Centering arms 32 further act as stabilizing means for the coracle ring 34 since the coracle 18 floats in the melt 20. The inner diameter 38 of the coracle ring 34 establishes the maximum diameter of the crystal 24. The coracle ring 34 acts as an extrusion device since it is in sliding contact with crystal 24. Further because of the close proximity of the coracle ring 34 to the crystal 24, heat distribution uniformity in both the radial direction and the vertical direction in the crystal growth area is almost assured because of the nature of the heat pipe coracle 18.

As to the construction of coracle ring 34 reference is made to FIGS. 3A, 3B, 4, and 5.

The heat pipe coracle 18 must endure conditions that are more extreme than the heat pipe rings 26 used for heating the crucible 14. These coracles 18 must float in the corrosive, molten metals of melt 20 while surrounded by the molten oxide encapsulating fluid 22. Therefore, the external coating must be impervious to corrosion, oxidation and dissolution. The coating material must be one that dissolves at a very slow rate and the dissolution products must not dope the III-V compound melt 20.

Niobium based heat pipes are ideally suited for this requirement in that niobium has a high melting point (2467° C.) and can be lattice matched with niobium nitride (NbN) after several grading layers. NbN has a high melting point (2750° C.) and is non-reactive with III-V compounds. The NbN on the surface will be graded to include cubic boron nitride until the outer coating is pure boron nitride which is resistant to oxidation in LEC growth conditions.

The coracle ring 34 is fabricated by vapor-depositing niobium over a hollow niobium torros 40, FIG. 4. Torrus 40 is formed by mating two semicircular shaped pieces 42 and 44, FIG. 3A and 3B. The centering arms or other suitable appendages are completely sealed in niobium.

An opening 46 is made in the side of torrus 40 for the purpose of cleaning and inserting a working fluid therein such as magnesium which is a desirable fluid for temperatures above 1000° C. Cesium is useable in the range of 500–1000° C. and a alloy fluid may be designed for a range from 400–1700° C.

The working fluid can be inserted into torrus 40 in a solid form. The atmosphere remaining in the torrus 40 is removed by vacuum and the opening 46 is then electron beam welded close.

The centering arms 32 are then attached to the outer surface of the torrus 40. 20 mils, for example, of pure niobium is deposited as layer 50 which seals and secures the joint 48, the opening 46, and arms 32. This niobium securing layer 50 is then graded in composition to a NbN intermediate layer 52 about 5 mils thick. This intermediate layer 52 is then graded to an outer coat 54 of cubic boron nitride about 1 mil thick.

Clearly, many modifications and variations of the present invention are possible in light of the above teachings and it is therefore understood, that within the inventive scope of the inventive concept, the invention may be practiced otherwise than specifically claimed.

What is claimed is:

1. A heat pipe coracle for use in a crystal growth apparatus, said heat pipe coracle comprising:

a coracle ring, said coracle ring being composed of a material resistant to attack from a melt of the crystal growth apparatus and having a density less than the melt so as to float upon said melt, said coracle ring being a torrus having a central opening therethrough, said central opening being of a diameter approximately equal to that of a single crystal pulled from the melt through said central opening, the single crystal being in sliding contact with said coracle ring to insure uniform heat distribution perpendicular to the vertical axis at the interface between the single crystal and the melt, and means for centering said coracle ring within a crucible of said crystal growth apparatus, said means for centering fixedly attached to said coracle ring and resistant to attack from said melt, said means for centering being in sliding contact with the wall of the crucible so that said heat pipe coracle can float upon said melt and move in a vertical direction.

2. A heat pipe coracle as defined in claim 1 wherein said heat pipe coracle is less dense than the melt and more dense than an encapsulating fluid.

3. A heat pipe coracle as defined in claim 1 wherein said means for centering comprise a plurality of centering arms.

4. A heat pipe coracle as defined in claim 1 wherein said heat pipe coracle has an outer coating impervious to corrosion, oxidation and dissolution in a III-V compound melt.

5. A heat pipe coracle as defined in claim 4 wherein said outer coating comprises niobium nitride.

6. A heat pipe coracle as defined in claim 4 wherein said coracle ring has a wall having multiple layers therein, said layers comprising:
- a first layer, said first layer being a shell layer and being an innermost layer;
- a second layer, said second layer sealing and securing said first layer,
- a third layer, said third layer being an intermediate grading layer, and
- a fourth layer, said fourth layer being said outer coat and being graded from said third layer.

7. A heat pipe coracle as defined in claim 6 wherein said layers comprise:
- a first layer of niobium being said shell layer;
- a second layer of niobium deposited upon said shell layer,
- a third layer, said third layer being graded from niobium to niobium nitride and
- a fourth layer, said fourth layer being graded from niobium nitride to boron nitride.

8. A heat pipe coracle as defined in claim 1 wherein a working fluid disposed in said heat pipe is able to function above 1,000° C.

9. A heat pipe coracle as defined in claim 8 wherein said working fluid is magnesium.

10. A heat pipe coracle as defined in claim 1 wherein a working fluid disposed in said heat pipe is able to function above 400° C. and less that 1000° C.

11. A heat pipe coracle as defined in claim 10 wherein said working fluid is cesium.

12. A heat pipe coracle as defined in claim 1 wherein a working fluid disposed in said heat pipe is an allow and able to function in the heat range from 400° C. to about 2,000° C.

* * * * *